US012581980B2

(12) United States Patent
Shibuya et al.

(10) Patent No.: US 12,581,980 B2
(45) Date of Patent: Mar. 17, 2026

(54) IC PACKAGE WITH FIELD EFFECT TRANSISTOR

(71) Applicant: TEXAS INSTRUMENTS INCORPORATED, Dallas, TX (US)

(72) Inventors: Makoto Shibuya, Beppu (JP); Kwang-Soo Kim, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 926 days.

(21) Appl. No.: 17/584,562

(22) Filed: Jan. 26, 2022

(65) Prior Publication Data

US 2023/0238350 A1     Jul. 27, 2023

(51) Int. Cl.
H01L 23/00     (2006.01)
H01L 21/768     (2006.01)
H01L 23/538     (2006.01)

(52) U.S. Cl.
CPC .............. H01L 24/48 (2013.01); H01L 24/85 (2013.01); *H01L 2224/4809* (2013.01); *H01L 2224/48225* (2013.01); *H01L 2924/10272* (2013.01); *H01L 2924/1033* (2013.01); *H01L 2924/1306* (2013.01); *H01L 2924/30107* (2013.01)

(58) Field of Classification Search
CPC ......... H01L 24/48; H01L 24/85; H01L 24/45; H01L 24/49; H01L 23/5386; H01L 2924/30107; H01L 2224/4809
See application file for complete search history.

(56) References Cited

U.S. PATENT DOCUMENTS

| | | | |
|---|---|---|---|
| 4,430,586 A | 2/1984 | Hebenstreit | |
| 4,727,308 A | 2/1988 | Huljak et al. | |
| 4,864,479 A | 9/1989 | Steigerwald et al. | |
| 5,038,113 A | 8/1991 | Katz et al. | |
| 5,132,889 A | 7/1992 | Hitchcock et al. | |
| 10,651,167 B2 | 5/2020 | De Rochemont | |
| 2008/0023825 A1* | 1/2008 | Hebert ................. | H10D 64/256 |
| | | | 257/E21.336 |
| 2008/0024102 A1* | 1/2008 | Hebert .................... | H01L 24/49 |
| | | | 257/E21.336 |
| 2008/0142932 A1* | 6/2008 | Beer ....................... | H01L 23/29 |
| | | | 438/114 |
| 2009/0001535 A1* | 1/2009 | Heng .................... | H01L 21/565 |
| | | | 257/676 |
| 2009/0108456 A1* | 4/2009 | Hebert .............. | H01L 23/49562 |
| | | | 257/762 |
| 2011/0079792 A1* | 4/2011 | Lostetter .............. | H10D 12/031 |
| | | | 257/77 |

(Continued)

*Primary Examiner* — Mohsen Ahmadi
(74) *Attorney, Agent, or Firm* — Ronald O. Neerings; Frank D. Cimino

(57) ABSTRACT

An IC package includes an interconnect having a first platform and a second platform that are spaced apart. The IC package includes a die superposing a portion of the first platform of the interconnect. The die has a field effect transistor (FET), and a matrix of pads for the FET situated on a surface of the die. The matrix of pads having a row of source pads and a row of drain pads. A drain wire bond extends from a first drain pad to a second drain pad of the row of drain pads and to the first platform of the interconnect. A source wire bond extends from a first source pad to a second source pad of the row of source pads, back over the first source pad and is coupled to a connection region of the first platform.

16 Claims, 6 Drawing Sheets

(56)     References Cited

U.S. PATENT DOCUMENTS

| | | | |
|---|---|---|---|
| 2011/0127606 A1* | 6/2011 | Bobde ................ | H10D 30/0512 |
| | | | 257/337 |
| 2014/0054597 A1* | 2/2014 | Ritenour ............ | H10D 62/8503 |
| | | | 438/478 |
| 2017/0025340 A1* | 1/2017 | Padmanabhan ... | H01L 23/49568 |
| 2017/0154831 A1* | 6/2017 | Standing ........... | H01L 21/32134 |
| 2019/0355643 A1* | 11/2019 | Hong ................. | H01L 23/4951 |
| 2019/0371932 A1* | 12/2019 | Hashizume ......... | H10D 84/143 |
| 2020/0161419 A1 | 5/2020 | Yang | |
| 2021/0013138 A1* | 1/2021 | Kim ...................... | H01L 21/565 |
| 2021/0175165 A1* | 6/2021 | Shibuya ............... | H01L 25/072 |
| 2021/0313283 A1* | 10/2021 | Wilson ................... | H01L 24/08 |
| 2023/0134075 A1* | 5/2023 | Leung ................... | H01L 21/56 |
| | | | 257/666 |

* cited by examiner

IC PACKAGE WITH FIELD EFFECT TRANSISTOR

TECHNICAL FIELD

This disclosure relates to integrated circuit (IC) packages, and more particularly, to an IC package that implements a field effect transistor (FET).

BACKGROUND

A high-electron-mobility transistor (HEMT), also known as heterostructure field effect transistor (HFET) or modulation-doped field effect transistor (MODFET), is a field-effect transistor (FET) incorporating a junction between two materials with different band gaps (e.g., a heterojunction) as the channel instead of a doped region (in contrast to a metal-oxide semiconductor FET (MOSFET)). HEMTs commonly use a material combination of gallium nitride (GaN) and aluminum gallium nitride (AlGaN), though there is wide variation, dependent on the application of the device. Like other FETs, HEMTs are used in integrated circuits as digital on-off switches. HEMTs are also used as amplifiers for large amounts of current using a small voltage as a control signal. Both of these uses are made possible by the unique current-voltage characteristics of HEMTs. HEMTs are able to operate at higher frequencies than other transistors, up to milli-meter wave frequencies, and are used in high-frequency products such as cell phones, satellite television receivers, voltage converters, and radar equipment. HEMTs are employed in satellite receivers and in power amplifiers.

Interconnects (alternatively referred to as lead frames) are the metal structures inside a chip package that carry signals from the die to the outside. A die inside the package is typically glued to the interconnect, and then bond wires attach the die pads to the leads. In the last stage of the manufacturing process, the interconnect is molded in a plastic case, and outside of the interconnect is cut-off.

SUMMARY

A first example relates to an integrated circuit (IC) package. The IC package has an interconnect with a first platform and a second platform that are spaced apart. The IC package includes a die superposing a portion of the first platform of the interconnect, the die having a field effect transistor (FET). The die having a matrix of pads for the FET situated on a surface of the die, the matrix of pads having a row of source pads and a row of drain pads. A first source pad in the row of source pads is distal to the second platform and a second source pad in the row of source pads is proximal to the second platform and the row of drain pads having a first drain pad and a second drain pad. The IC package includes a drain wire bond that extends from the first drain pad to the second drain pad of the row of drain pads and to the first platform of the interconnect. The IC package also includes a source wire bond that extends from the first source pad to the second source pad of the row of source pads, back over the first source pad and is coupled to a connection region of the first platform of the interconnect spaced apart from the die.

A second example relates to an IC package with an interconnect having a first platform and a second platform that are spaced apart. The IC package has a die superposing a portion of the first platform of the interconnect, the die having an FET. The die has a matrix of pads with interleaving rows of source pads and rows of drain pads. A first source pad in the rows of source pads is distal to the second platform and a second source pad in the rows of source pads is proximal to the second platform and the rows of drain pads have a first drain pad and a second drain pad. The IC package includes a set of drain wire bonds extending from a respective first drain pad to a respective second drain pad of a respective row of drain pads and to the first platform of the interconnect. The IC package also includes a set of source wire bonds extending from a respective first source pad to a respective second source pad of a respective row of source pads, back over the respective first source pad and coupled to a section of the second platform of the interconnect spaced apart from the die.

A third example relates to a method for forming an integrated circuit (IC) package. The method includes mounting a die on a first platform of an interconnect, the die having an FET. The die has a matrix of pads for the FET situated on a surface of the die, the matrix of pads having a row of source pads and a row of drain pads. A first source pad in the row of source pads is distal to a second platform and a second source pad in the row of source pads is proximal to the second platform and the row of drain pads having a first drain pad and a second drain pad. The method also includes attaching a drain wire bond to couple the first drain pad and the second drain pad to a second platform of an interconnect. The method further includes attaching a source wire bond to couple the first source pad to the second source pad of the row of source pads, back over the first source pad and to couple a connection region of the first platform of the interconnect spaced apart from the die.

DETAILED DESCRIPTION

This description relates to an integrated circuit (IC) package that includes components for a field effect transistor (FET). The FET is employable in a power converter, such as an alternating current (AC) to direct current (DC) power converter, a DC-to-DC power converter or a DC-to-AC power converter. The IC package includes an interconnect (e.g., a lead frame) having a first platform and a second platform (e.g., leads) that are spaced apart. The IC package also includes a die superposing a portion of the first platform of the interconnect. The FET is embedded in the die. The die has a matrix of pads (e.g., a pad matrix) formed of inter-leaving rows of source pads and rows of drain pads. A first source pad in the rows of source pads is distal to the second platform and a second source pad in the rows of source pads is proximal to the second platform. Similarly, the rows of drain pads have a first drain pad and a second drain pad.

The IC package includes a set of drain wire bonds extending from a respective first drain pad to a respective second drain pad of a respective row of drain pads and to the first platform of the interconnect. The IC package also has a set of source wire bonds that extend from a respective first source pad to a respective second source pad of a respective row of source pads, back over the respective first source pad and are coupled to a section of the second platform of the interconnect spaced apart from the die. Stated differently, the set of source wire bonds double back over the respective first source pad in the rows of source pads. Accordingly, the set of source wire bonds (relative to the set of drain wire bonds) form a partial antiparallel loop to curtail parasitic inductance during intervals where the FET is turned on (e.g., operating in the linear mode or the saturation mode). Accordingly, the FET is employable in applications where switching noise due to parasitic inductance needs to be avoided and a high switching rate (e.g., from about 1 Megahertz (MHz) to about 1 Gigahertz (GHz) or more) is needed.

Figures 1, 2:
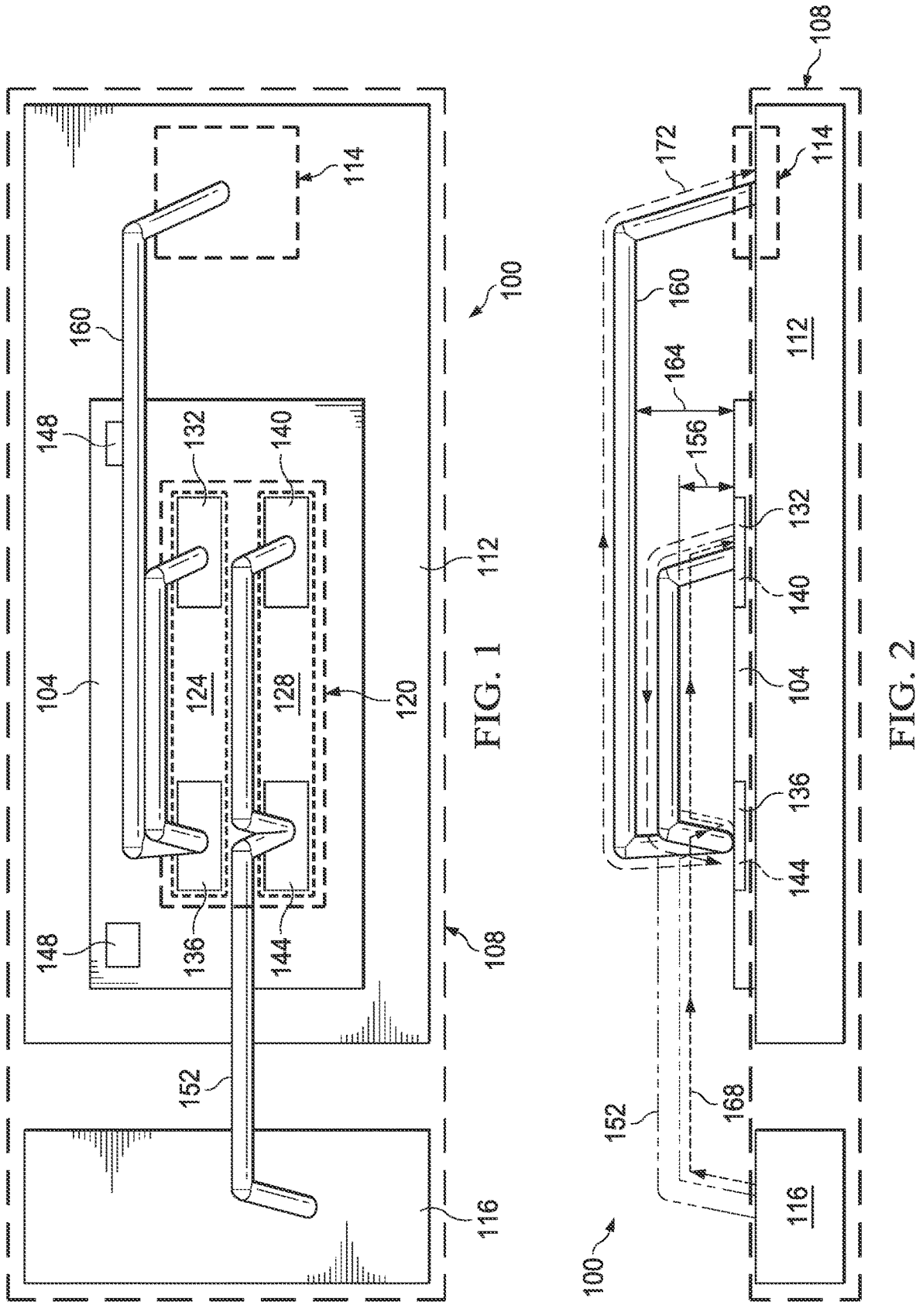
FIG. 1 illustrates an overhead diagram of an example of an IC package with a field effect transistor (FET).
FIG. 2 illustrates a side view of the IC package of FIG. 1.

FIG. 1 illustrates an overhead diagram of an example of an IC package 100. FIG. 2 illustrates a side view of the IC package 100 of FIG. 1. For purposes of simplification of explanation, FIGS. 1 and 2 employ the same reference numbers to denote the same structure. Additionally, molding (e.g., a plastic casing) of the IC package has been removed for purposes of illustration. The IC package 100 includes a die 104 mounted on an interconnect 108 (e.g., a lead frame). The interconnect 108 includes a first platform 112 (e.g., a lead) and a second platform 116 (e.g., another lead) that are spaced apart. In some examples, the interconnect 108 is implemented with a direct bonded copper (DBC) substrate. The die 104 is mounted on the first platform 112 of the interconnect 108. The die 104 superposes a first portion of the first platform 112. A connection region 114 of the first platform 112 is uncovered. The connection region 114 is spaced apart from the die 104.

In some examples, the IC package 100 is employable as a quad flat no leads (QFN) or a dual flat no leads (DFN) IC chip. In such a situation, the first platform 112 and the second platform 116 are employable as connection pads of the resultant IC chip. Accordingly, the IC package 100 is employable to interact with other components of a circuit, including, but not limited to other IC chips in a power converter.

The die 104 includes a field effect transistor (FET) embedded therein. The FET is an N-channel FET (NFET) or a P-channel FET (PFET). In various examples, the FET is implemented as a high-electron-mobility transistor (HMET), such as a gallium nitride (GaN) FET or a silicon carbide (SiC) FET with a switching time of about 10 nanoseconds (ns) or less. In some examples, the FET of the die 104 is implemented on a power converter, such as an alternating current (AC) to direct current (DC) converter, a DC-to-DC converter (e.g., a boost converter or a buck converter) or a DC-to-AC converter (alternatively referred to as an inverter). In such examples, the FET of the die 104 is implemented as a high side FET or a low side FET.

The FET includes a matrix of pads 120 situated on a surface of the die 104 that includes two (2) columns of pads, wherein the matrix of pads 120 include K number of rows of pads, where K is a positive and even integer, greater than or equal to two (2). The matrix of pads 120 includes K/2 rows of source pads 124 and K/2 rows of drain pads 128 for the FET. Stated differently, the matrix of pads 120 has an equal number of source pads and drain pads. In examples where K is greater than two (2), (e.g. K is equal to 4, 6, 8, etc.), the rows of source pads 124 and the rows of drain pads 128 are interleaving. The rows of source pads 124 include a first source pad 132 and a second source pad 136. The first source pad 132 and the second source pad 136 of the rows of source pads 124 provide conductive connection pads to a source of the FET. The first source pad 132 is distal to the second platform 116 and the second source pad 136 is proximal to the second platform 116. Similarly, the rows of drain pads 128 includes a first drain pad 140 and a second drain pad 144. The first drain pad 140 and the second drain pad 144 of the rows of drain pads 128 provide conductive connections to a drain of the FET. The first drain pad 140 is distal to the second platform 116 of the interconnect 108 and the second drain pad 144 is proximal to the second platform 116 of the interconnect 108.

The die 104 also includes gate pads 148 situated on the surface of the die 104 that provide a conductive connection to a gate of the FET. In the example illustrated, there are two (2) gate pads 148, but in other examples, there are more or less gate pads 148.

A drain wire bond 152 is coupled to the first drain pad 140 and extends from the first drain pad 140 to the second drain pad 144 and to the second platform 116. More particularly, the drain wire bond 152 is coupled to the first drain pad 140, to the second drain pad 144 and to the second platform 116 of the interconnect 108. Also, as illustrated in FIG. 2, the drain wire bond 152 has a first segment that forms a first arch between the first drain pad 140 and the second drain pad 144, such that the drain wire bond 152 does not contact a region of the die 104 between the first drain pad 140 and the second drain pad 144. Similarly, the drain wire bond 152 has a second segment that forms a second arch between the second drain pad 144 and the second platform 116, such that the drain wire bond 152 does not contact a region of the die 104 or the interconnect 108 between the second drain pad 144 and the second platform 116. The first arch and the second arch have an apex that is a first distance 156 (denoted by arrows) away from the die 104. The first distance 156 is about 400 to about 600 micrometers (μm). Unless otherwise stated, in this description, 'about' preceding a value means +/−10 percent of the stated value.

A source wire bond 160 is coupled to the first source pad 132 and extends from the first source pad 132 to the second source pad 136, back over the first source pad 132 (without making contact) and to the connection region 114 of the first platform 112 of the interconnect 108. That is, the source wire bond 160 is coupled to the first source pad 132, the second source pad 136 and to the connection region 114. More particularly, as illustrated in FIG. 2, the source wire bond 160 has a first segment that forms a first arch with a first radius of curvature between the first source pad 132 and the second source pad 136 and the source wire bond 160 does not contact the die 104 between the first source pad 132 and the second source pad 136. Also, the source wire bond 160 has a second segment that forms a second arch with a second radius of curvature between the second source pad 136 and the connection region 114, and the second segment of the source wire bond 160 does not contact the die 104 in between the second source pad 136 and the connection region 114. The second radius of curvature is greater than the first radius of curvature. That is, the second arch is taller than the first arch. The first arch on the source wire bond 160 has the apex that is about the first distance 156 (about 400 μm to about 600 μm) away from the die 104. Additionally, the second arch has an apex that is a second distance 164 (denoted by arrows) away from the die 104, wherein the second distance is about 800 μm to about 1200 μm. As illustrated, the source wire bond 160 doubles back over the first source pad 132 to reach the connection region 114 of the first platform 112 of the interconnect 108.

In operation, in situations where the FET is a PFET and the FET is turned on (e.g., operating in the linear or saturation mode of operation), current flows from the second platform 116 through the rows of drain pads 128 to the rows of source pads 124 and to the connection region 114. For illustration purposes, a first set of arrows 168 are included to show current flow from the second platform 116 of the interconnect 108 to the second drain pad 144 and to the first drain pad 140. Additionally, a second set of arrows 172 are included to show current flow from the first source pad 132 to the second source pad 136 and to the connection region 114 of the first platform 112 of the interconnect 108.

As illustrated, the current flows through the drain wire bond 152 and the source wire bond 160 in a manner that forms a partial antiparallel loop. Thus, the current flowing through the drain wire bond 152 and the source wire bond 160 flow in opposite directions to reduce parasitic capacitance. More generally, as the switching speed of the FET increases (e.g., to a range from about 1 Megahertz (MHz) to a range of abut 1 Gigahertz (GHz) or more), switching noise increases. Switching noise, $SW_N$ of the FET is defined with Equation 1.

$$SW_N = L * \frac{di}{dt} \qquad \text{Equation 1}$$

Wherein:
L is the parasitic, in Henries (H) inductance of the FET;
i is the current, in amperes (A) flowing from the drain to the source through the FET (in situations where the FET is an NFET); and
t is the time, in seconds (s).

As demonstrated by Equation 1, the switching noise, $SW_N$ varies as a function of the change in current over time and the parasitic inductance, L. Thus, reduction in the parasitic inductance, L in the FET causes a corresponding reduction in the switching noise, $SW_N$. Accordingly, by providing the FET with the drain wire bond 152 and the source wire bond 160 in the manner demonstrated, the switching noise, $SW_N$ of the FET is also reduced.

Figure 3:
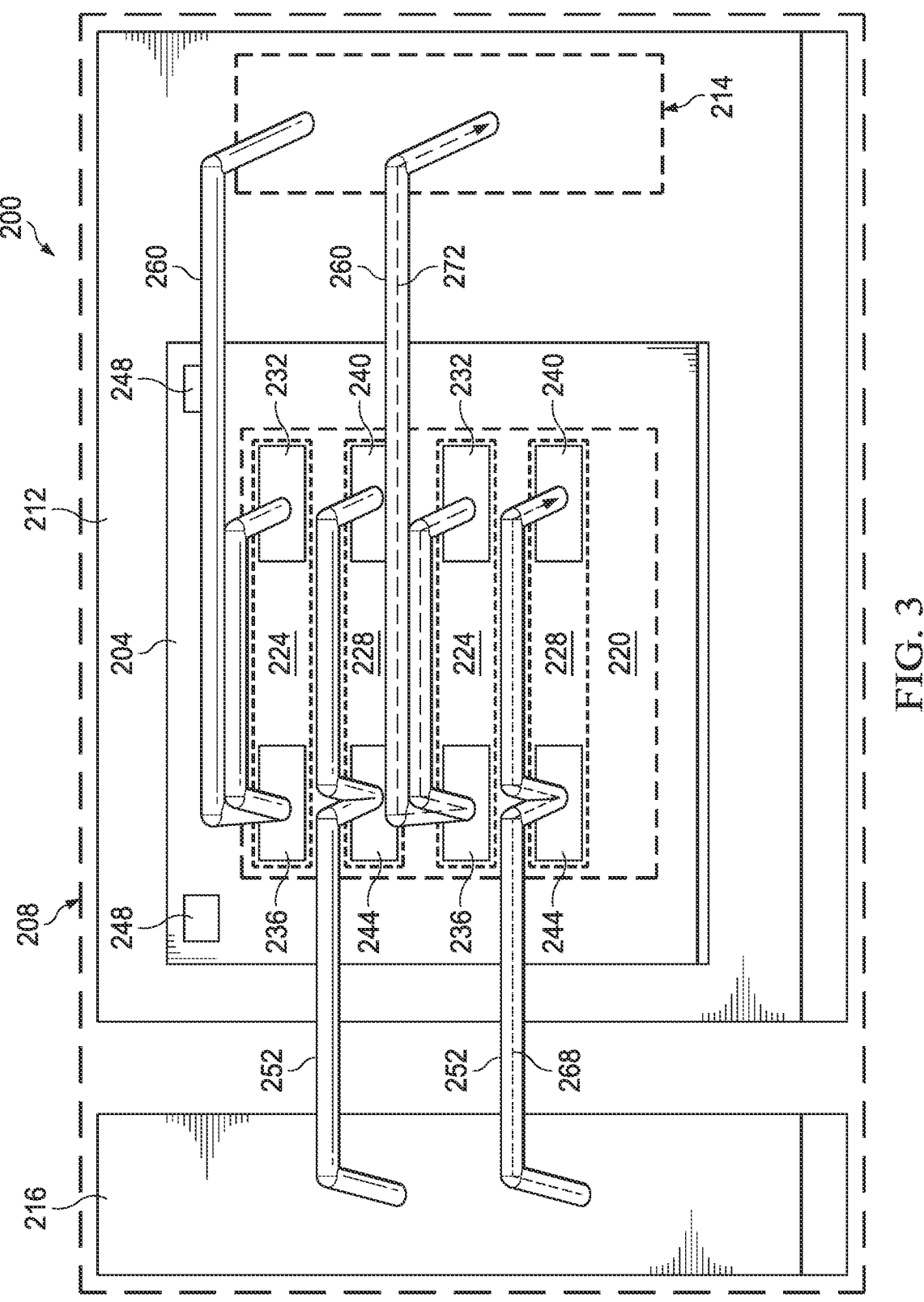
FIG. 3 illustrates a perspective three dimensional (3D) view of an IC package.

FIG. 3 illustrates a perspective view of a three dimensional (3D) diagram of an example of an IC package 200. The IC package 200 includes a die 204 mounted on an interconnect 208 (e.g., a lead frame). The interconnect 208 includes a first platform 212 and a second platform 216 that are spaced apart. The die 204 is mounted on the first platform 212 of the interconnect 208. The die 204 superposes a first portion of the first platform 212. A connection region 214 of the first platform 212 is uncovered. The connection region 214 is spaced apart from the die 204.

In some examples, the IC package 200 is employable in a QFN or DFN IC chip. In such a situation, the first platform 212 and the second platform 216 are employable as connection pads of the resultant IC chip. Accordingly, the IC package 200 is employable to interact with other components of a circuit, including, but not limited to other IC chips in a power converter, such as an AC-to-DC converter, a DC-to-DC converter (e.g., a boost converter or a buck converter) or a DC-to-AC converter. The die 204 includes an embedded FET, such as an NFET or a PFET. In various examples, the FET is implemented as an HMET, such as a GaN FET or a SiC FET with a switching time of about 10 nanoseconds (ns) or less.

The FET includes a matrix of pads 220 situated on a surface of the die 204 that includes two (2) columns of pads, wherein the columns include four (4) rows of pads, but in other examples there are more or less rows of pads. The matrix of pads 220 includes two (2) rows of source pads 224 and two (2) rows of drain pads 228 for the FET. In other examples, there are more or less rows of source pads 224 and rows of drain pads 228, but in each such example, there is the same number of rows of source pads 224 as rows of drain pads 228.

The matrix of pads 220 has an equal number of source pads and drain pads. The rows of source pads 224 and the rows of drain pads 228 are interleaving. The rows of source pads 224 include a first source pad 232 and a second source pad 236. The first source pad 232 and the second source pad 236 of the rows of source pads 224 provide conductive connection pads to a source of the FET. The first source pad 232 is distal to the second platform 216 and the second source pad 236 is proximal to the second platform 216. Similarly, the rows of drain pads 228 includes a first drain pad 240 and a second drain pad 244. The first drain pad 240 and the second drain pad 244 of the rows of drain pads 228 provide conductive connections to a drain of the FET. The first drain pad 240 is distal to the second platform 216 of the interconnect 108 and the second drain pad 244 is proximal to the second platform 216 of the interconnect 108.

The die 204 also includes gate pads 248 situated on the surface of the die that provide a conductive connection to a gate of the FET. In the example illustrated, there are two (2) gate pads 248, but in other examples, there are more or less gate pads 248.

A set of drain wire bonds 252 are coupled to the first drain pad 240, to the second drain pad 244 and to the second platform 216. The set of drain wire bonds 252 extend in parallel with respect to each other. There are an equal number of drain wire bonds 252 in the set of drain wire bonds 252 as there are rows of drain pads 228. Thus, in the example illustrated, there are two drain wire bonds 252. Each drain wire bond 252 is coupled to a respective first drain pad 240, to a respective second drain pad 244 and to the second platform 216 of the interconnect 208. As illustrated, each drain wire bond 252 has a first segment that forms a first arch between the respective first drain pad 240 and the respective second drain pad 244, such that the drain wire bond 252 does not contact a region of the die 204 between the first drain pad 240 and the second drain pad 244. Similarly, each drain wire bond 252 has a second segment that forms a second arch between the respective second drain pad 244 and the second platform 116, such that each drain wire bond 252 does not contact a region of the die 204 or the interconnect 208 between the respective second drain pad 244 and the second platform 216. The first arch and the second arch have an apex that is a first distance away from the die 204. The first distance is about 400 μm to about 600 μm.

A set of source wire bonds 260 are coupled to the rows of source pads 224, such that there are an equal number of source wire bonds 260 in the set of source wire bonds as rows of source pads 224. The set of source wire bonds 260 extend in parallel with respect to each other. Each source wire bond 260 extends from the respective first source pad 232 to the respective second source pad 236, back over to the respective first source pad 232 (without making contact) and to the connection region 214 of the first platform 212 of the interconnect 208. More particularly, as illustrated, each source wire bond 260 has a first segment that forms a first arch with a first radius of curvature between the respective first source pad 232 and the respective second source pad 236 and each source wire bond 260 does not contact the die

204 between the respective first source pad 132 and the respective second source pad 136. Also, each source wire bond 260 has a second segment that forms a second arch with a second radius of curvature between the respective second source pad 236 and the connection region 214, and the second segment of the source wire bond 260 does not contact the respective first source pad 232 or the die 204 between the second source pad 236 and the connection region 214. The second radius of curvature is greater than the first radius of curvature. That is, the second arch is taller than the first arch. The first arch on each source wire bond 260 has an apex that is about the first distance (e.g., about 400 μm to about 600 μm) away from the die 204. Additionally, the second arch has an apex that is a second distance away from the die 204, wherein the second distance is about 800 μm to about 1200 μm. As illustrated, each source wire bond 260 doubles back over the respective first source pad 232 to reach the connection region 214 of the first platform 212 of the interconnect 208.

In operation, in situations where the FET is a PFET and the FET is turned on (e.g., operating in the linear or saturation mode of operation), current flows from the second platform 216 through the rows of drain pads 228 to the rows of source pads 224 and to the connection region 214. For illustration purposes, a first arrow 268 is included to show current flow from the second platform 216 of the interconnect 208 to a respective second drain pad 244 and to the first drain pad 240 of a particular row of drain pads 228. Additionally, a second arrow 272 is included to show current flow from the respective first source pad 132 to the respective second source pad 136 and to the connection region 214 of the first platform 212 of the interconnect 208 of a particular row of source pads 224.

As illustrated, the current flows through the set of drain wire bond 252 and the set of source wire bonds 260 in a manner that forms a partial antiparallel loop. Thus, the current flowing through the set of drain wire bonds 252 and the set of source wire bonds 260 flows in opposite directions to reduce parasitic capacitance. More generally, as the switching speed of the FET increases (e.g., to a range from about 1 Megahertz (MHz) to a range of abut 1 Gigahertz (GHz) or more), switching noise increases. Switching noise, $SW_N$ of the FET is defined with Equation 1.

More particularly, in the example illustrated, each drain wire bond 252 has a parasitic drain loop inductance, $L_D$ of about 2.9 nanohenries (nH). Additionally, each source wire bond 260 has a parasitic source loop inductance, $L_S$ of about 2.5 nH, and a mutual inductance. $L_M$ between a given drain wire bond 252 and a given source wire bond 260 of about 0.3 nH. The total parasitic inductance, L for Equation 1, is calculatable from Equation 2.

$$L = L_D + L_S + 2L_M \qquad \text{Equation 2}$$

In the example with $L_D \approx 2.9$ nH, $L_S \approx 2.5$ nH and $L_M \approx 0.3$ nH, the total parasitic inductance, L is about 6.0 nH. Conversely, in a conventional approach where both the source wire bonds and the drain wire bonds have a similar architecture (and the source wire bonds do not double back), the parasitic drain loop inductance, $L_D$ and the parasitic source loop inductance, $L_S$ are about equal ($L_D \approx L_S \approx 2.9$ nH in one example). Accordingly, in the conventional approach, the mutual inductance is about 1.0 nH, such that (by Equation 2), the total parasitic inductance, L would be about 7.8 nH. As demonstrated by Equation 1, the switching noise, $SW_N$ varies as a function of the change in current over time and the parasitic inductance, L, defined in Equation 2. Thus, reduction in the parasitic inductance, L in the FET causes a corresponding reduction in the switching noise, $SW_N$. Accordingly, by providing the FET with the set of drain wire bonds 252 and the set of source wire bonds 260 in the manner demonstrated, the switching noise, $SW_N$ of the FET is also reduced relative to the conventional approach.

Figure 4:
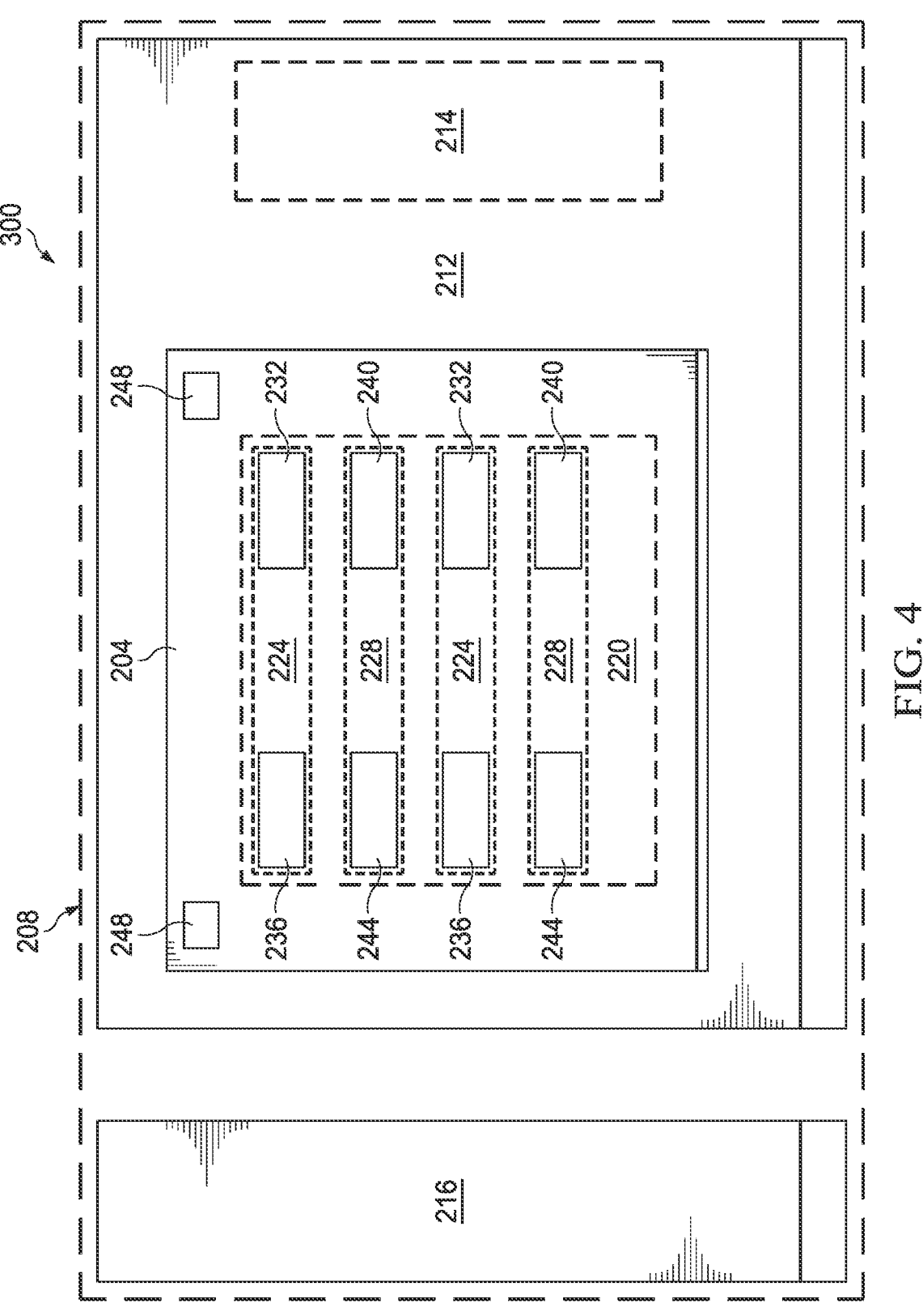
FIG. 4 illustrates a first stage of an example method for forming an IC package with an FET.
Figure 5:
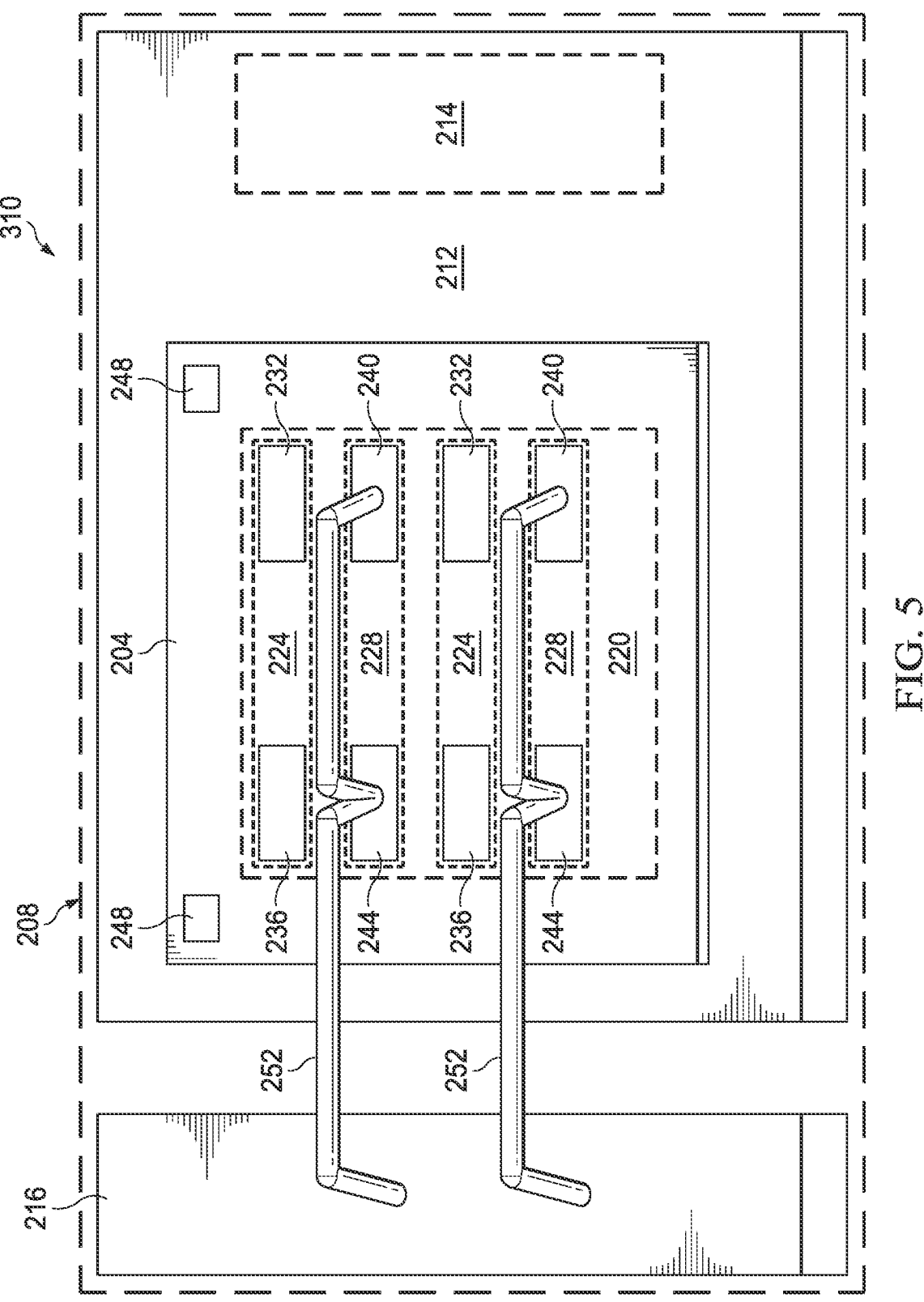
FIG. 5 illustrates a second stage of an example method for forming an IC package with an FET.
Figure 6:
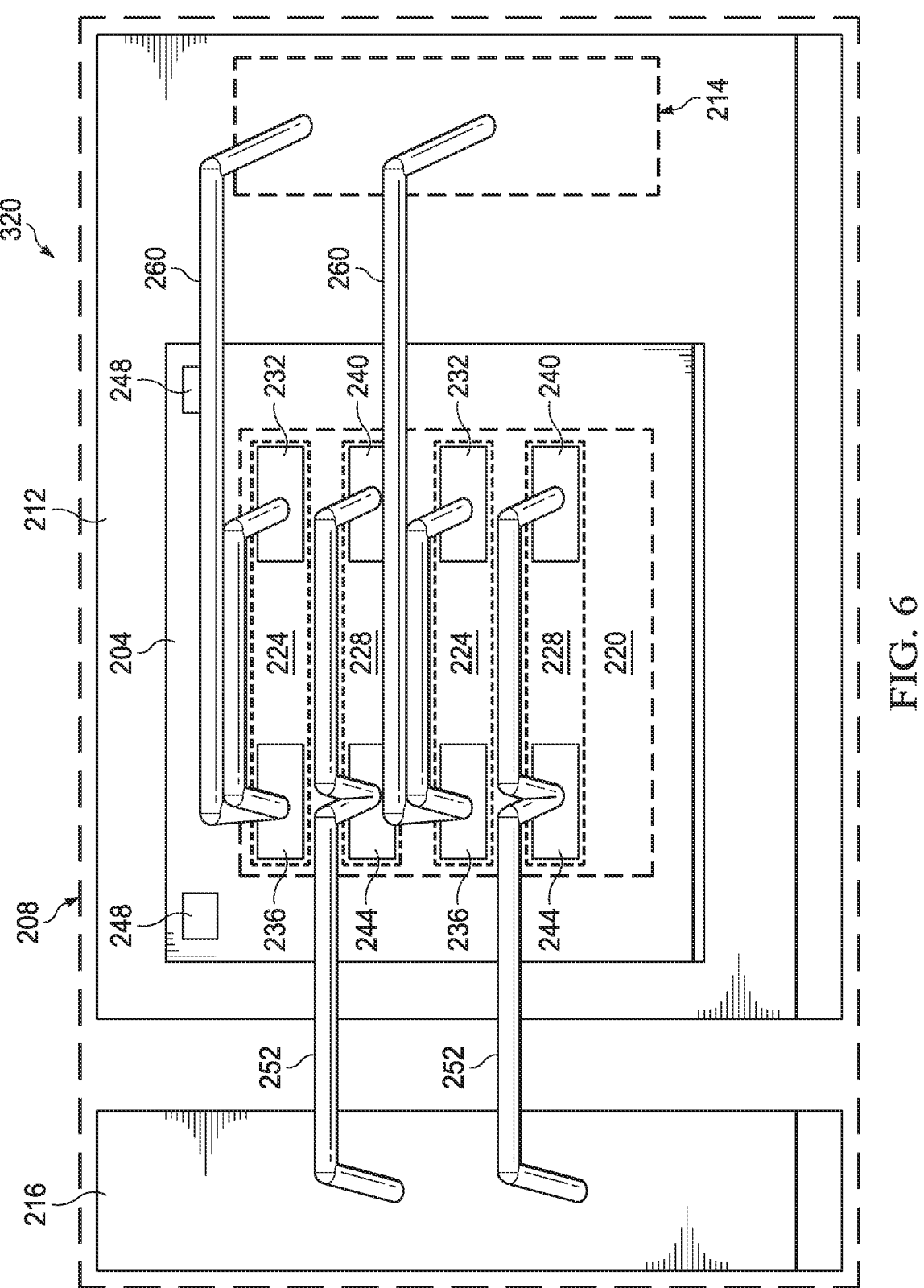
FIG. 6 illustrates a third stage of an example method for forming an IC package with an FET.

FIGS. 4-6 illustrate stages of a method forming an IC package, such as the IC package 100 of FIGS. 1 and 2 and/or the IC package 200 of FIG. 3. For purposes of simplification of explanation, FIGS. 3 and 4-6 employ the same reference numbers to denote the same structures. Additionally, some structures are not re-introduced.

In a first stage, at 300, as illustrated in FIG. 4, the die 204 is mounted on the first platform 212 of the interconnect 208. The connection region 214 is spaced apart from the die 204 and is not covered by the die 204. The die 204 includes the FET embedded therein. The die 204 also include the matrix of pads 220 that has two rows of source pads 224 and two rows of drain pads 228. Each row of source pads 224 has a first source pad 232 and a second source pad 236. Each row of drain pads 228 has a first drain pad 240 and a second drain pad 244.

In a second stage, at 310, as illustrated in FIG. 5, the set of drain wire bonds 252 are coupled to the rows of drain pads 228 and to the second platform 216 of the interconnect 208. As demonstrated, each drain wire bond 252 is coupled to a respective first drain pad 240, a respective second drain pad 244 and to the second platform 216 of the interconnect 208.

In a third stage, at 320, as illustrated in FIG. 6, the set of source wire bonds 260 are coupled to the rows of source pads 224. More particularly, each source wire bond 260 is coupled to a respective first source pad 232, and to a respective second source pad 236. Additionally, each source wire bond 260 doubles back and passes over the first source pad 232 (without making contact) and contacts the connection region 214 of the first platform 212 of the interconnect 208.

Figure 7:
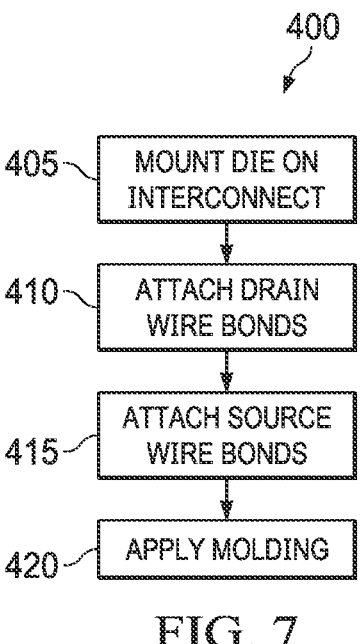
FIG. 7 illustrates a flowchart of an example method for forming an IC package with an FET.

FIG. 7 illustrates a flowchart of an example method 400 for forming an IC package. At 405 a die (e.g., the die 104 of FIG. 1) is mounted on a first platform (e.g., the first platform 112 of FIG. 1) of an interconnect (e.g., the interconnect 108 of FIG. 1). The die includes an FET embedded therein. Moreover, the die has a matrix of pads for the FET (e.g., the matrix of pads 120 of FIG. 1) situated on a surface of the die. The matrix of pads includes a row of source pads (e.g., the row of source pads 132 of FIG. 1) and a row of drain pads (e.g., the row of drain pads 128 of FIG. 1). A first source pad (e.g., the first source pad 132 of FIG. 1) in the row of source pads is distal to a second platform of the interconnect (e.g., the second platform 116 of FIG. 1) and a second source pad (e.g., the second source pad 136 of FIG. 1) in the row of source pads is proximal to the second platform and the row of drain pads having a first drain pad (e.g., the first drain pad 140 of FIG. 1) and a second drain pad (e.g., the second drain pad 144 of FIG. 1).

At 410, a drain wire bond is attached (e.g., adhered or mounted) such that the drain wire bond is coupled to the first drain pad, to the second drain pad and to the second platform of the interconnect. At 415, a source wire bond (e.g., the source wire bond 160 of FIG. 1) is attached (e.g., adhered or mounted) such that the source wire bond is coupled to the first source pad, the second source pad of the row of source pads, back over the first source pad and is coupled to a connection region of the first platform of the interconnect spaced apart from the die. At 420, molding is applied to the resultant device to form the IC package.

Modifications are possible in the described embodiments, and other embodiments are possible, within the scope of the claims.

What is claimed is:

1. An integrated circuit (IC) package comprising:
an interconnect comprising a first platform and a second platform that are spaced apart;
a die superposing a portion of the first platform of the interconnect, the die comprising a field effect transistor (FET), the die having a matrix of pads for the FET situated on a surface of the die, the matrix of pads comprising a row of source pads and a row of drain pads, wherein a first source pad in the row of source pads is distal to the second platform and a second source pad in the row of source pads is proximal to the second platform and the row of drain pads having a first drain pad and a second drain pad;
a drain wire bond that extends from the first drain pad to the second drain pad of the row of drain pads and to the second platform of the interconnect; and
a source wire bond that extends from the first source pad to the second source pad of the row of source pads, back over the first source pad forming a loop and is coupled to a connection region of the first platform of the interconnect spaced apart from the die, wherein the loop is a partial antiparallel loop relative to the drain wire bond such that current in the drain wire bond is configured to flow from the second platform of the interconnect in a first direction to the second drain pad and to the first drain pad in the first platform and current in the source wire bond is configured to flow in a second direction from the first source pad to the second source pad.

2. The IC package of claim 1, wherein the interconnect is a direct bonded copper substrate.

3. The IC package of claim 2, wherein the FET has a gate pad situated on the surface of the die.

4. The IC package of claim 1, wherein the FET is a gallium nitride (GaN) FET.

5. The IC package of claim 1, wherein the FET is a silicon carbide (SiC) FET.

6. The IC package of claim 1, wherein a first segment of the source wire bond extends between the first source pad and the second source pad to a distance of about 400 micrometers to about 600 micrometers away from the die and a second segment of the source wire bond extends from the second source pad to the first platform of the interconnect and extends to a distance of about 800 micrometers to about 1200 micrometers away from the die.

7. An integrated circuit (IC) package comprising:
an interconnect comprising a first platform and a second platform that are spaced apart;
a die superposing a portion of the first platform of the interconnect, the die comprising a field effect transistor (FET), the die having a matrix of pads for the FET situated on a surface of the die, the matrix of pads comprising a row of source pads and a row of drain pads, wherein a first source pad in the row of source pads is distal to the second platform and a second source pad in the row of source pads is proximal to the second platform and the row of drain pads having a first drain pad and a second drain pad, wherein the row of source pads is a first row of source pads and the row of drain pads is a first row of drain pads, the matrix of pads further comprising a second row of source pads, and a second row of drain pads, wherein a first source pad in the second row of source pads is distal to the second platform of the interconnect and a second source pad in the second row of source pads is proximal to the second platform of the interconnect and the second row of drain pads has a first drain pad and a second drain pad;
a drain wire bond that extends from the first drain pad to the second drain pad of the row of drain pads and to the second platform of the interconnect; and
a source wire bond that extends from the first source pad to the second source pad of the row of source pads, back over the first source pad and is coupled to a connection region of the first platform of the interconnect spaced apart from the die.

8. The IC package of claim 7, wherein the drain wire bond is a first drain wire bond and the source wire bond is a first source wire bond, the IC package further comprising:
a second drain wire bond coupled to the first drain pad and the second drain pad of the second row of drain pads and is parallel to the first drain wire bond; and
a second source wire bond coupled to the first source pad and the second source pad of the second row of source pads and is parallel to the first source wire bond.

9. An integrated circuit (IC) package comprising:
an interconnect comprising a first platform and a second platform that are spaced apart;
a die superposing a portion of the first platform of the interconnect, the die comprising a field effect transistor (FET), the die having a matrix of pads comprising interleaving rows of source pads and rows of drain pads, wherein a first source pad in the rows of source pads is distal to the second platform and a second source pad in the rows of source pads is proximal to the second platform and the rows of drain pads have a first drain pad and a second drain pad;
a set of drain wire bonds extending from a respective first drain pad to a respective second drain pad of a respective row of drain pads in the first platform and to the second platform of the interconnect; and
a set of source wire bonds extending from a respective first source pad to a respective second source pad of a respective row of source pads, back over the respective first source pad and coupled to a section of the first platform of the interconnect spaced apart from the die, wherein the set of source wire bonds form partial antiparallel loops relative to the first set of wire bonds such that current in the first set of wire bonds is configured to flow from the second platform in a first direction to the second drain pad to the first drain pad of a respective row of drain pads in the first platform of the interconnect and current in the set of source wire bonds is configured to flow in a second direction from the first source pad to the second source pad of a respective row of source pads.

10. The IC package of claim 9, the FET having a gate pad on the die superposing the portion of the first platform of the interconnect.

11. The IC package of claim 9, wherein the FET is a gallium nitride (GaN) FET or a silicon carbide (SiC) FET.

12. The IC package of claim 9, wherein a first segment of the source wire bonds that extends between the first source pad and the second source pad of a respective row of source pads extends to a distance of about 400 micrometers to about 600 micrometers away from the die and a second segment of the source wire bond that extends from the first source pad of the respective row of source pads to the first platform of the interconnect extends to a distance of about 800 micrometers to about 1200 micrometers away from the die.

13. The IC package of claim 9, wherein the FET has gate pads situated on the surface of the die.

14. A method for forming an integrated circuit (IC) package, the method comprising:

mounting a die on a first platform of an interconnect the die comprising a field effect transistor (FET), the die having a matrix of pads for the FET situated on a surface of the die, the matrix of pads comprising a row of source pads and a row of drain pads, wherein a first source pad in the row of source pads is distal to a second platform and a second source pad in the row of source pads is proximal to the second platform and the row of drain pads having a first drain pad and a second drain pad;

attaching a drain wire bond to couple the first drain pad and the second drain pad to a second platform of an interconnect; and attaching a source wire bond to couple the first source pad to the second source pad of the row of source pads, back over the first source pad and to couple a connection region of the first platform of the interconnect spaced apart from the die, wherein the source wire bond forms a partial antiparallel loop relative to the drain wire bond such that current in the drain wire bond is configured to flow from the second platform in a first direction to the second drain pad in the first platform and to the first drain pad and current in the source wire bond is configured to flow in a second direction from the first source pad to the second source pad.

15. The method of claim 14, wherein the interconnect is a direct bonded copper substrate.

16. The method of claim 14, wherein the FET is a gallium nitride (GaN) FET or a silicon carbide (SiC) FET.

\* \* \* \* \*